(12) United States Patent
Teng et al.

(10) Patent No.: US 11,041,978 B2
(45) Date of Patent: Jun. 22, 2021

(54) OPTICAL PLATE

(71) Applicant: National Taiwan Normal University, Taipei (TW)

(72) Inventors: Tun-Chien Teng, Taipei (TW); Sheng-Guo Xu, Taipei (TW)

(73) Assignee: NATIONAL TAIWAN NORMAL UNIVERSITY, Taipei (TW)

( * ) Notice: Subject to any disclaimer, the term of this patent is extended or adjusted under 35 U.S.C. 154(b) by 229 days.

(21) Appl. No.: 16/516,457

(22) Filed: Jul. 19, 2019

(65) Prior Publication Data
US 2020/0217995 A1 Jul. 9, 2020

(30) Foreign Application Priority Data

Jan. 8, 2019 (TW) .................................. 108100669

(51) Int. Cl.
G02B 3/08 (2006.01)
G02B 3/00 (2006.01)

(52) U.S. Cl.
CPC ........ G02B 3/08 (2013.01); G02B 2003/0093 (2013.01)

(58) Field of Classification Search
CPC .......................... G02B 3/08; G02B 2003/0093
USPC ............ 359/741–743; 345/1.1–1.3, 102, 690
See application file for complete search history.

(56) References Cited

U.S. PATENT DOCUMENTS

| 2010/0259566 A1 | 10/2010 | Watanabe |
| 2013/0235560 A1 | 9/2013 | Etienne et al. |
| 2017/0146840 A1 | 5/2017 | Dai et al. |

FOREIGN PATENT DOCUMENTS

| CN | 101868814 A | 10/2010 |
| CN | 103874956 A | 6/2014 |
| JP | 2007065335 A | * 3/2007 |
| TW | 201719247 A | 6/2017 |

OTHER PUBLICATIONS

Taiwanese Search Report issued in counterpart Taiwanese Application No. 108100669, dated Sep. 18, 2019, with English translation.

* cited by examiner

Primary Examiner — William Choi
(74) Attorney, Agent, or Firm — Birch, Stewart, Kolasch & Birch LLP

(57) ABSTRACT

An optical plate includes at least two first optical portions for respectively covering two light emitting modules, and at least one second optical portion for covering a gap between the light emitting modules. Each first optical portion receives light rays emitted from a respective light emitting module and causes the same to emit along a predetermined direction. The second optical portion has first and second inner inclined surfaces, and first and second outer inclined surfaces. The inner inclined surfaces guide the light rays emitted from the respective light emitting modules toward the outer inclined surfaces, respectively, such that the light rays emitting out therefrom are parallel to the predetermined direction.

11 Claims, 18 Drawing Sheets

OPTICAL PLATE

CROSS-REFERENCE TO RELATED APPLICATION

This application claims priority to Taiwanese Patent Application No. 108100669, filed on Jan. 8, 2019.

FIELD

The disclosure relates to an optical plate, more particularly to an optical plate for mounting on a display or a light guide plate.

BACKGROUND

With the development of display technology, it is now possible to see a large TV wall in a lively commercial area. This allows the advertising industry to enlarge a picture on the TV wall, thereby catching the attention of the public and achieving the effect of promoting a product. Referring to FIG. 1, a TV wall is generally composed of a plurality of light emitting modules 9 (for example, displays) arranged in a matrix. However, because a gap 91 is formed between each two adjacent ones of the light emitting modules 9, crisscross black (or dark) lines will appear on the display, thereby affecting the visual effect of the display, which in turn, affect the comfort of the people watching the display.

SUMMARY

Therefore, an object of the present disclosure is to provide an optical plate that is capable of overcoming the aforesaid drawback of the prior art.

Accordingly, an optical plate of this disclosure is suitable for mounting on a display device which includes at least two light emitting modules spaced apart from each other to form a gap between adjacent lateral edges thereof. Each of the at least two light emitting modules is capable of emitting first light rays. The optical plate includes at least two first optical portions configured to respectively cover the at least two light emitting modules, and at least one second optical portion connected between the at least two first optical portions and configured to cover the gap. Each of the at least two first optical portions has a light entry surface configured to receive the first light rays emitted from a respective one of the at least two light emitting modules and is configured to cause the first light rays to emit along a predetermined direction. The at least one second optical portion has an inner optical structure corresponding to the gap, and an outer optical structure opposite to the inner optical structure. The inner optical structure has a first flat surface facing the gap, and a first inner inclined surface and a second inner inclined surface extending inclinedly, outwardly and respectively from two opposite lateral edges of the first flat surface toward the light entry surfaces of the at least two first optical portions. The outer optical structure has a first outer inclined surface opposite to the first inner inclined surface, and a second outer inclined surface opposite to the second inner inclined surface. The first outer inclined surface has a slope matching that of the first inner inclined surface. The second outer inclined surface has a slope matching that of the second inner inclined surface. Each of the first and second inner inclined surfaces is configured to guide the first light rays emitted from the respective one of the at least two light emitting modules toward a respective one of the first and second outer inclined surfaces such that the first light rays emitting out of the first and second outer inclined surfaces are parallel to the predetermined direction.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
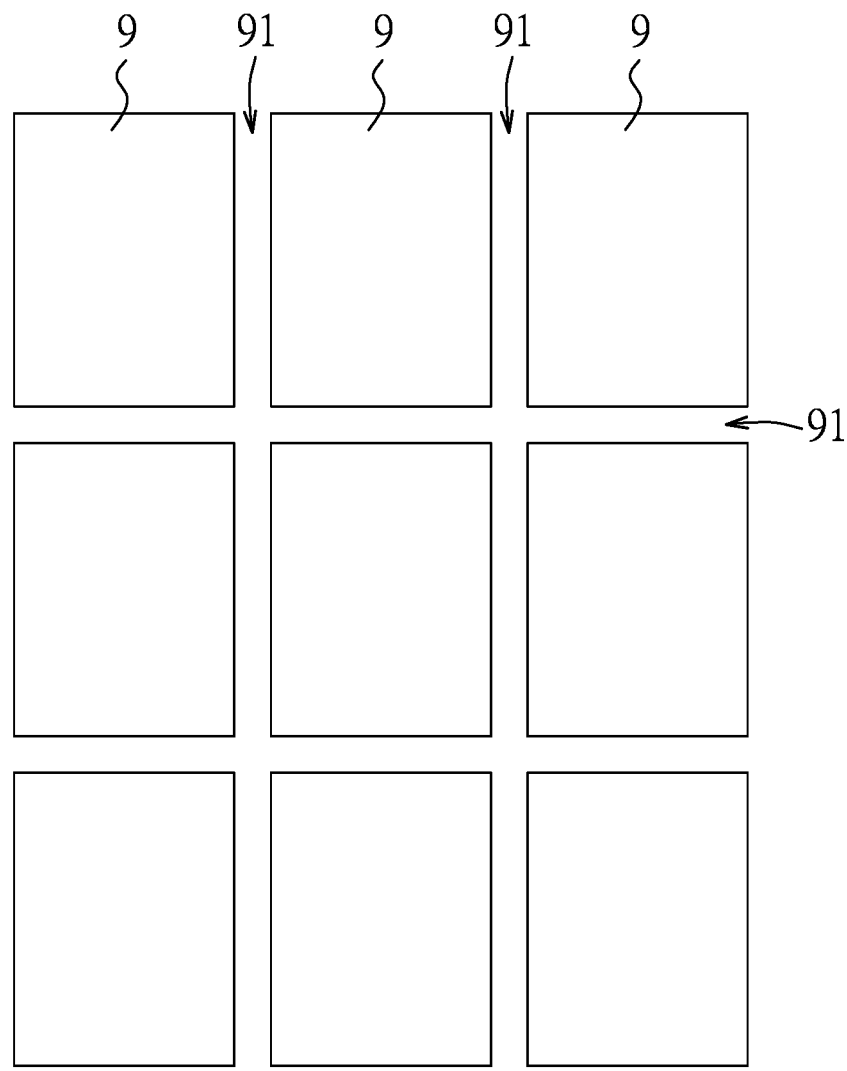
FIG. 1 illustrates a conventional TV wall composed of a plurality of light emitting modules.

Before the present disclosure is described in greater detail with reference to the accompanying embodiments, it should be noted herein that like elements are denoted by the same reference numerals throughout the disclosure.

Figure 2:
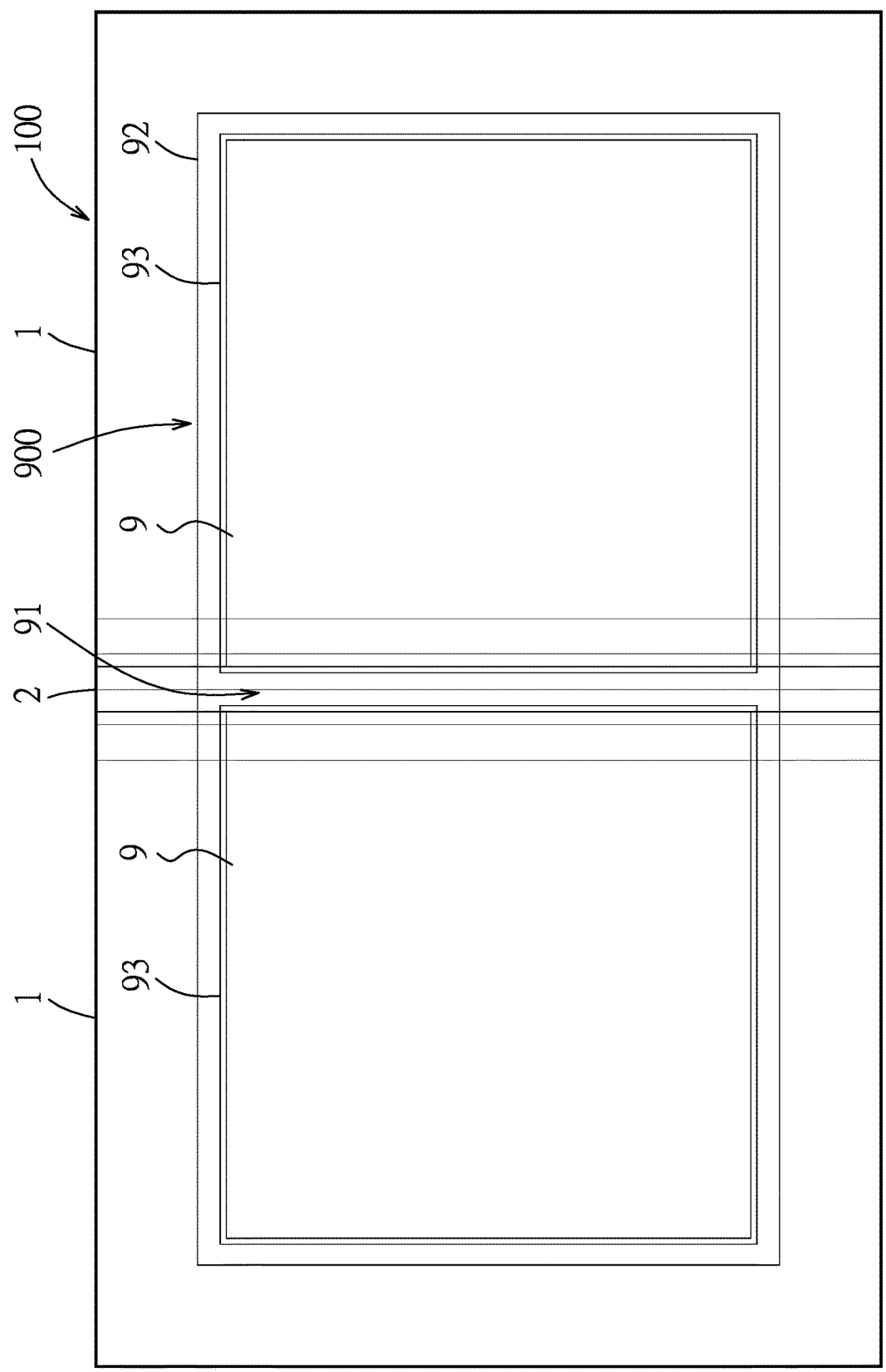
FIG. 2 is a front view of an optical plate according to the first embodiment of this disclosure mounted to a display device.
Figure 3:
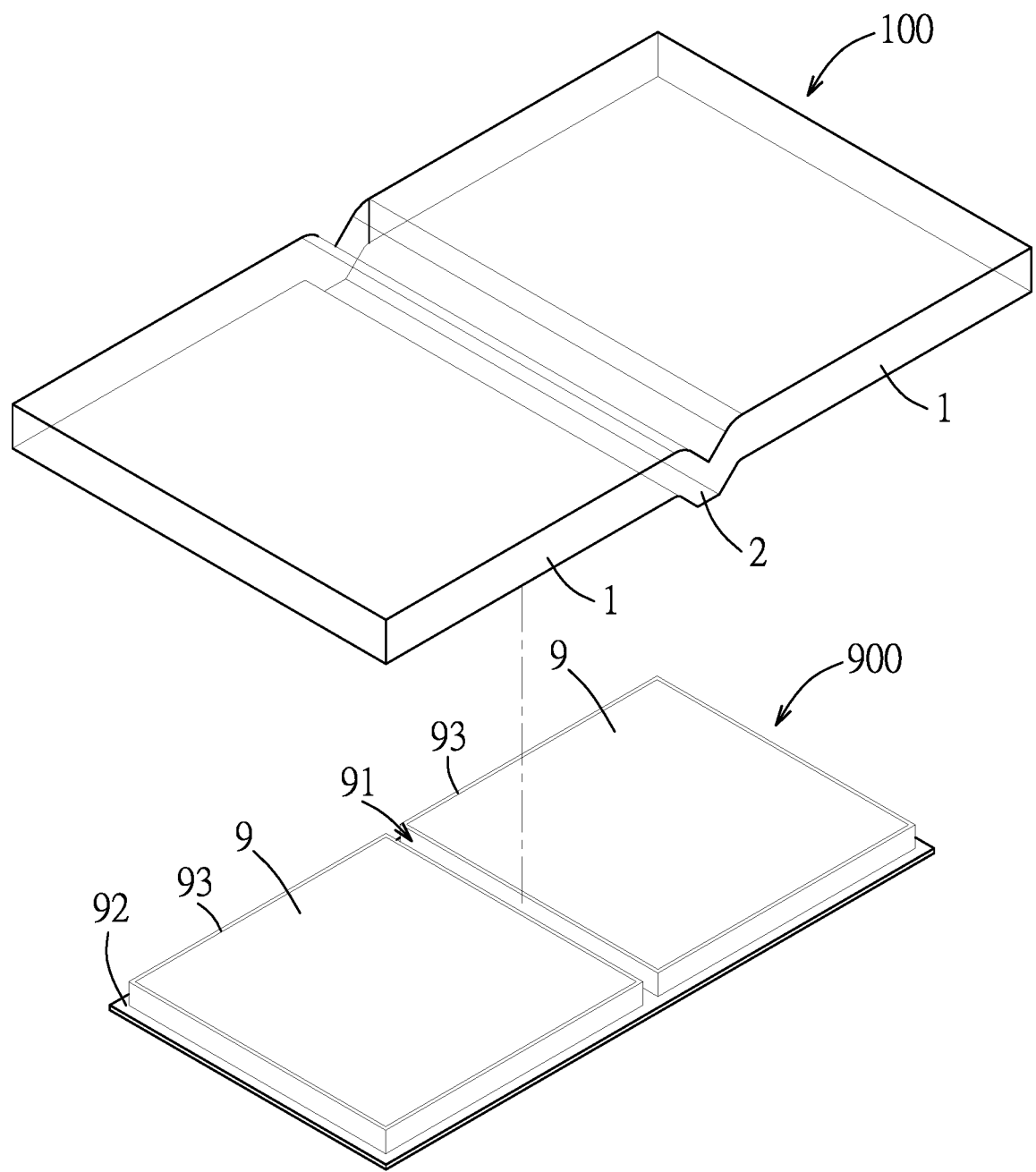
FIG. 3 is an exploded perspective view of the optical plate of the first embodiment and the display device.

Referring to FIGS. 2 and 3, an optical plate 100 according to the first embodiment of the present disclosure is suitable for mounting on a display device 900, and includes two first optical portions 1 and a second optical portion 2. The display device 900 includes two light emitting modules 9 spaced apart from each other such that a gap 91 is formed between adjacent lateral edges thereof. In this embodiment, the light emitting modules 9 are disposed on a support plate 92. The light emitting modules 9 are, for example, displays. Each light emitting module 9 has an outer frame 93 for fixing by the optical plate 100. Each light emitting module 9 can be driven to emit first light rays 971 that travel along a light entry direction.

Figure 4:
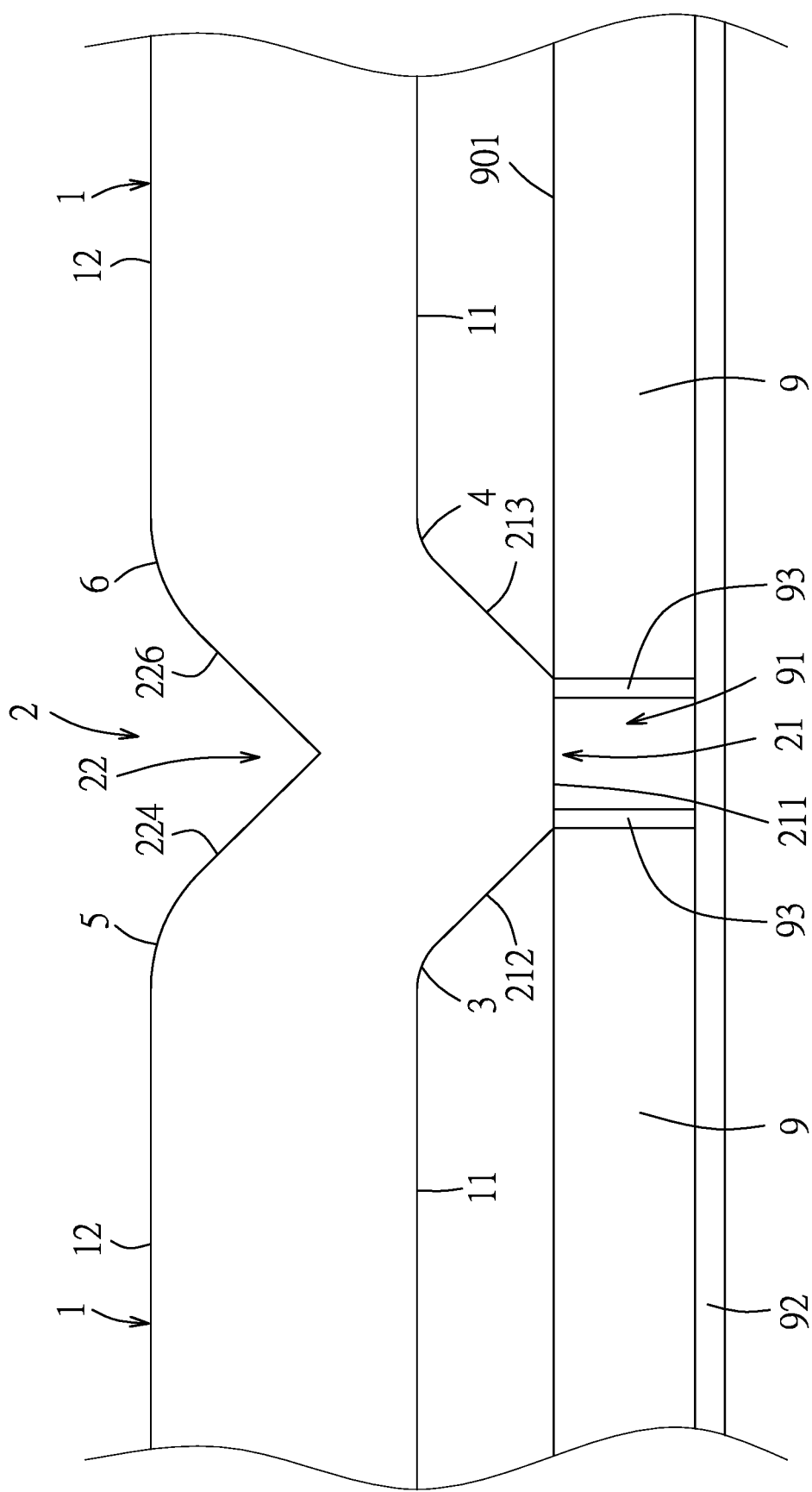
FIG. 4 is an enlarged fragmentary side view of an assembly of the optical plate of the first embodiment and the display device.
Figure 5:
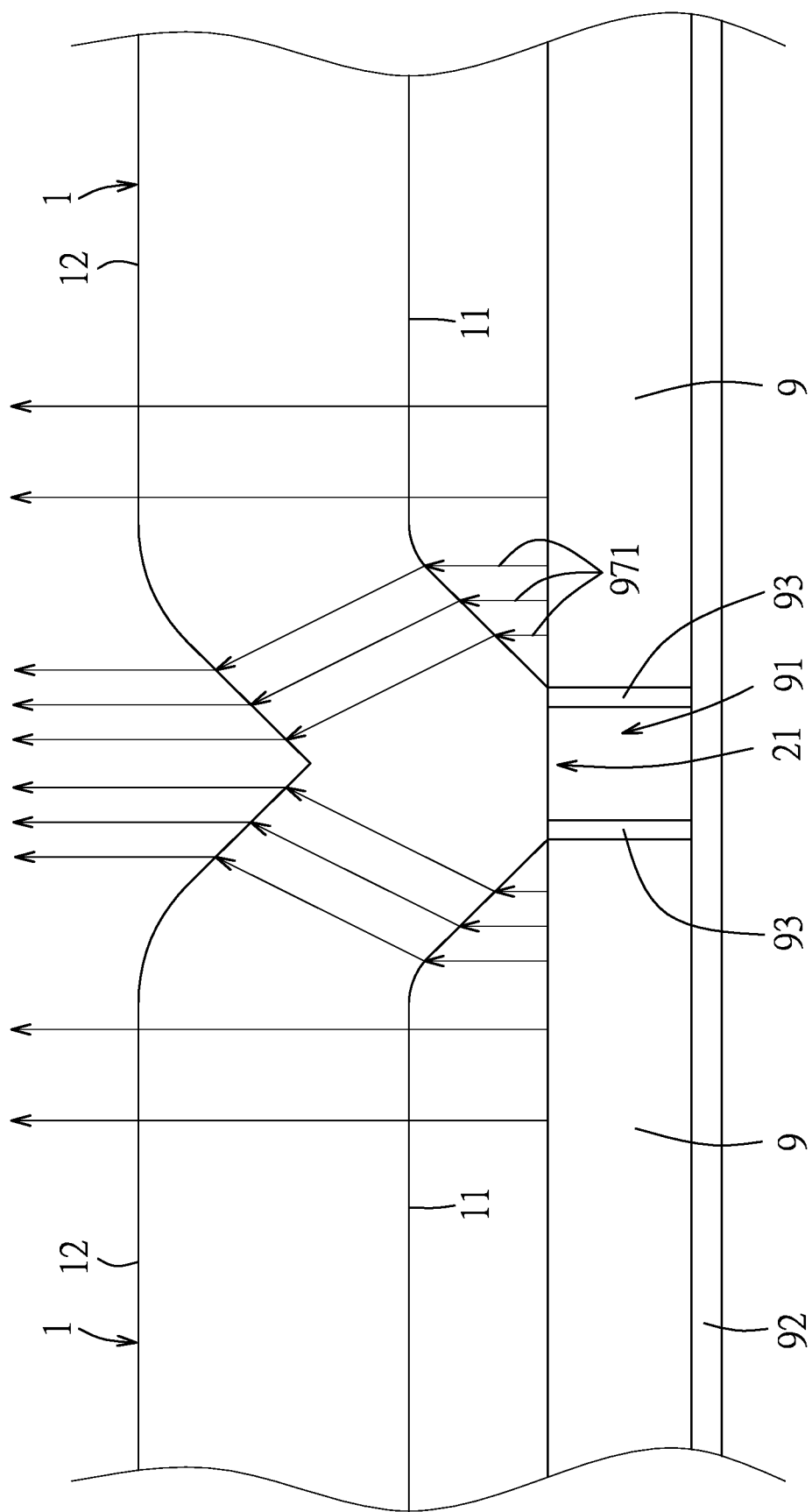
FIG. 5 is a view similar to FIG. 4, but illustrating how first light rays pass through the optical plate of the first embodiment.

Referring to FIGS. 4 and 5, in combination with FIG. 2, the first optical portions 1 respectively cover the light emitting modules 9. Each first optical portion 1 has a light entry surface 11 facing the respective light emitting module 9, and a light exit surface 12 opposite to the light entry surface 11. In this embodiment, the light entry surface 11 receives the first light rays 971, and guides the same toward the light exit surface 12. The light exit surface 12 causes the first light rays 971 to emit along a predetermined direction which is parallel to the light entry direction.

The second optical portion 2 is located between the first optical portions 1, and has two opposite lateral edges connected to the first optical portions 1. The second optical portion 2 covers the gap 91, and has an inner optical structure 21 corresponding to the gap 91, and an outer optical structure 22 opposite to and cooperating with the inner optical structure 21. In this embodiment, the second optical portion 2 is fixed to the outer frames 93 of the light emitting modules 9, and the outer optical structure 22 extends inwardly toward the gap 91.

Specifically, the inner optical structure 21 has a first flat surface 211 facing the gap 91, and a first inner inclined surface 212 and a second inner inclined surface 213 extending inclinedly, outwardly and respectively from two opposite lateral edges of the first flat surface 211 toward the light entry surfaces 11 of the respective first optical portions 1. In this embodiment, the first flat surface 211 has an area equal to the cross section of the gap 91 so as to cover the gap 91. Each of the first and second inner inclined surfaces 212, 213 overlaps and covers a portion of a corresponding one of the light emitting modules 9. That is, each of the first and second inner inclined surfaces 212, 213 covers a portion of a light emitting surface 901 of the corresponding light emitting module 9 which is proximate to the gap 91. The first and second inner inclined surfaces 212, 213 extend inclinedly in opposite directions and have equal slopes. The slopes of the first and second inner inclined surfaces 212, 213 are not limited to what is disclosed herein, and may be adjusted according to the actual requirement.

The outer optical structure 22 has a first outer inclined surface 224 with a slope matching that of the first inner inclined surface 212, and a second outer inclined surface 226 with a slope matching that of the second inner inclined surface 213. In this embodiment, the first and second outer inclined surfaces 224, 226 are connected to each other at inner lateral edges thereof to form a V-shaped cross section. The first outer inclined surface 224 is opposite and parallel to the first inner inclined surface 212, while the second outer inclined surface 226 is opposite and parallel to the second inner inclined surface 213. A junction of the first and second outer inclined surfaces 224, 226 is located corresponding to the center of the first flat surface 211. The first and second inner inclined surfaces 212, 213 of the inner optical structure 21 guide the first light rays 971 toward the first and second outer inclined surfaces 224, 226 of the outer optical structure 22 which are located above the first flat surface 211 of the inner optical structure 21. Through this, the first and second outer inclined surfaces 224, 226 can receive averagely and respectively the first light rays 971 from the first inner inclined surface 212 and the first light rays 971 from the second inner inclined surface 213, and guide the first light rays 971 to emit out in an emitting direction parallel to the predetermined direction. Thus, the lateral edges of the pictures displayed by the light emitting modules 9 as seen by the viewers are interconnected, and the black (dark) lines formed by the gap 91 are covered, so that the viewers can only see the pictures displayed by the light emitting modules 9, and the pictures have an equal proportion extension visual effects.

Figure 6:
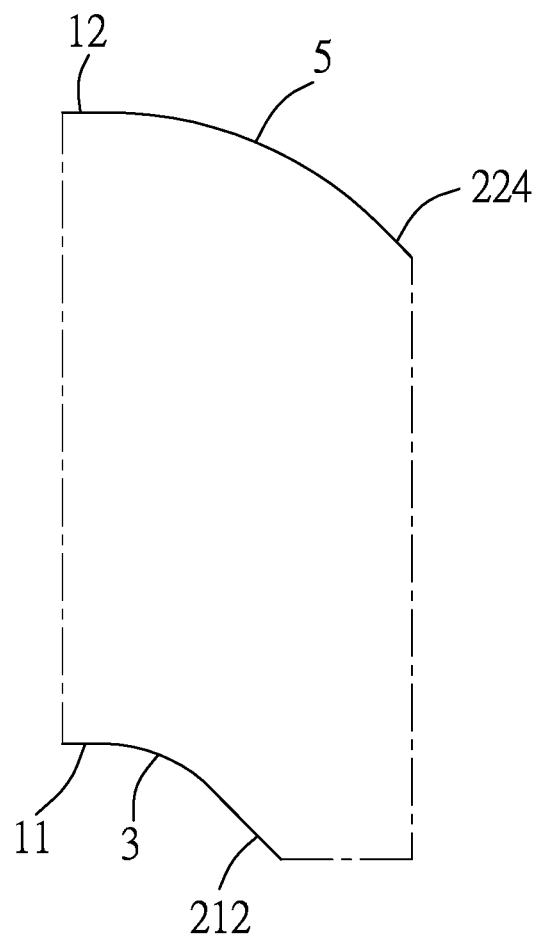
FIG. 6 is an enlarged schematic view of a portion of FIG. 4, illustrating a detailed structure of a first outer arcuate portion and a first inner arcuate portion.

Referring to FIG. 6, in combination with FIG. 4, the optical plate 100 further includes a first inner arcuate portion 3 connected between the first inner inclined surface 212 and the light entry surface 11 of one of the first optical portions 1, a second inner arcuate portion 4 connected between the second inner inclined surface 213 and the light entry surface 11 of the other first optical portion 1, a first outer arcuate portion 5 connected between the first outer inclined surface 224 and the light exit surface 12 of the one of the first optical portions 1, and a second outer arcuate portion 6 connected between the second outer inclined surface 226 and the light exit surface 12 of the other first optical portion 1. The curvature of the first outer arcuate portion 5 is designed according to the curvature of the first inner arcuate portion 3, while the curvature of the second outer arcuate portion 6 is designed according to the curvature of the second inner arcuate portion 4.

The first inner arcuate portion 3 is provided such that, when the first light rays 971 enter the optical plate 100, the first light rays 971 can scatter and emit toward the junction of the first outer arcuate portion 224 and the light exit surface 12 and the surrounding thereof. Through this, dark lines formed on a junction of the first inner inclined surface 212 and the light entry surface 11 are shielded. On the other hand, the first outer arcuate portion 5 is provided such that, the first light rays 971 emitting toward the junction of the first outer arcuate portion 224 and the light exit surface 12 and the surrounding thereof can emit out along a path parallel to the path of its entry into the first inner arcuate portion 3. Through this, the pictures displayed by the light emitting modules 9 will not exhibit crisscross black (dark) lines, thereby improving the comfort of the viewers when viewing the picture. The curvature of the first outer arcuate portion 5 must be correspondingly adjusted according to the range of light scattering caused by the first inner arcuate portion 3. Further, the curvature of the second outer arcuate portion 6 and the curvature of the second inner arcuate portion 4 must also achieve the same function as the first outer arcuate portion 5 and the first inner arcuate portion 3, respectively, so that a detailed description thereof is omitted herein.

Figure 7:
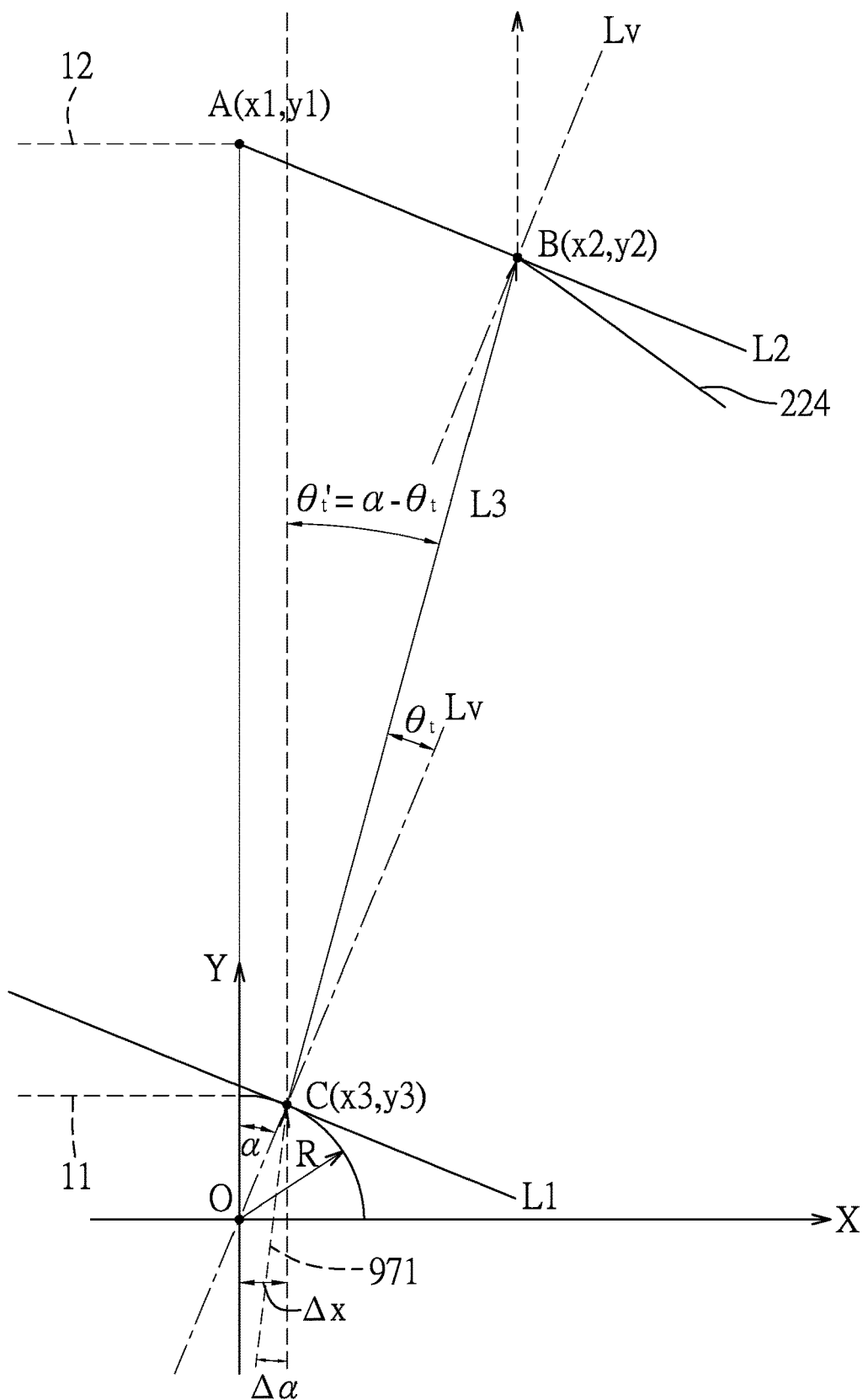
FIG. 7 is a coordinate diagram of FIG. 6, illustrating the relation between a curvature of the first outer arcuate portion and a curvature of the first inner arcuate portion.

Referring to FIG. 7, in combination with FIG. 6, since the calculation for each of the first and second outer arcuate portions 5, 6 is similar, only the calculation of forming (determining) the first outer arcuate portion 5 will be exemplified. The first inner arcuate portion 3 is first formed on the junction of the first inner inclined surface 212 and the light entry surface 11, after which the first outer arcuate portion 5 is calculated according to the coordinates of the first light rays 971 incident on the first inner arcuate portion 3. The parameters required in this calculation are stated hereinafter. The first outer arcuate portion 5 and the first inner arcuate portion 3 are placed on a coordinate plane, as shown in FIG. 7, and under the premise that the curvature of the first inner arcuate portion 3 is preset, the origin (O) of the coordinate plane is the center of the first inner arcuate portion 3, a horizontal axis (X) passes through the center or origin (O), and a vertical axis (Y) passes through the center (O) and is perpendicular to the horizontal axis (X). The known parameters include the radius (R) of the first inner arcuate portion 3, the coordinates at the highest point A(x1, y1) of the first outer arcuate portion 5 on the vertical axis (Y), the distance (Δx) between the first light ray 971 and the origin (O), and the refractive index of the optical plate 100. In this embodiment, point A(x1, y1) is located at the junction of the first outer inclined surface 224 and the light exit surface 12, but is not limited thereto. The unknown parameters include point B(x2, y2) of the first outer arcuate portion 5; point C(x3,y3) in which the first light ray 971 is incident on the first inner arcuate portion 3, where x3=Δx; an entry angle (α+Δα) (where Δα is a negative value) of the first light ray 971 incident on point C; a refraction angle (θt) of the first light ray 971 incident on point C; and an included angle (θt') between the first light ray 971 from point C to point B and a normal line (Lv). Through the aforesaid known parameters in cooperation with the condition that the emitting direction of the first light ray 971 emitting out of point B must be parallel to the light entry direction thereof at point C, the coordinates of point B may be found. The calculation process is as below.

In this calculation process, taking the first light ray 971 incident on point C as an example, initially, the entry angle (α+Δα) of the first light ray 971 incident on point C can be obtained using a trigonometric function, after which the refraction angle (θt) can be obtained using the Fresnel formula, and then the included angle (θt'). Next, the coordinates of point B can be obtained by solving the simultaneous equations. One of the simultaneous equations is the first straight line equation (L1) passing through point C, another one of the simultaneous equations is the second straight line equation (L2) (y=$m_2$x+$n_2$) passing through point A and point B, and yet another one of the simultaneous equations is the third straight line equation (L3) (y=$m_3$x+$n_3$) passing through point C and point B. Wherein, since the emitting direction of the first light ray 971 emitting out of point B must be parallel to the light entry direction thereof at point C, it can be known that the first straight line equation (L1) is equal to the second straight line equation (L2). Subsequently, it is known that $m_2$ in the second straight line equation (L2) is tan a, $n_2$ can be obtained by substituting point A. Further, the slope ($m_3$) in the third straight line equation (L3) is −cot θt', and $n_3$ can be obtained by substituting point C. The y3 in point C can be found using the Pythagorean theorem. After obtaining the values of $n_2$ and $n_3$, the coordinates of point B can be found by solving the simultaneous equations. Afterwards, the coordinates of another first light ray 971 is used to calculate the coordinates emitting out of the first outer arcuate portion 5. By calculating the coordinates of the first light ray 971 emitting out of each point of the first outer arcuate portion 5, the first outer arcuate portion 5 can be formed, and the curvature thereof can be obtained.

Figure 8:
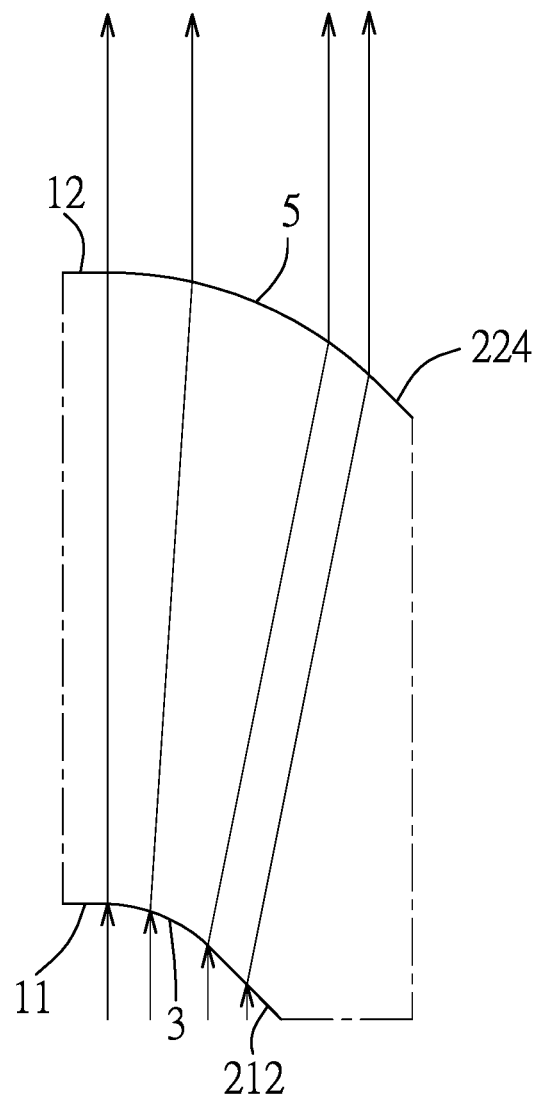
FIG. 8 is a view similar to FIG. 6, but illustrating how the first light rays pass through the first outer arcuate portion and the first inner arcuate portion.

Referring to FIG. 8, the first inner arcuate portion 3 causes the first light rays 971 to scatter in the optical plate 100 and guides the same toward the first outer arcuate portion 5. The first outer arcuate portion 5, in turn, causes the first light rays 971 to emit out along the predetermined direction. Through this, the black (dark) lines formed at the junction of the light entry surface 11 and the first inner inclined surface 212 can be eliminated.

Figure 9:
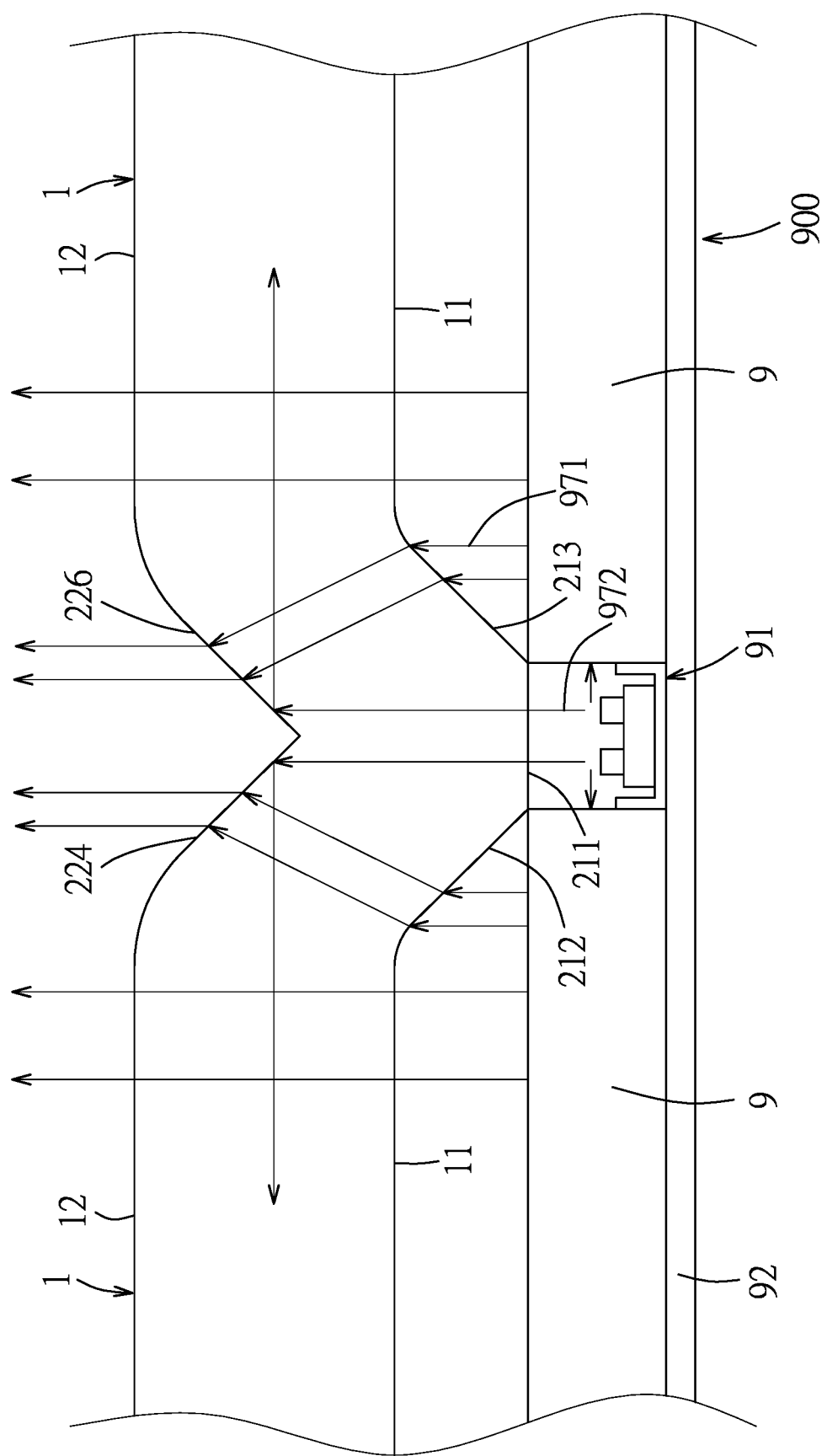
FIG. 9 is a view similar to FIG. 5, but illustrating the first embodiment mounted to an alternative form of the display device.

Referring to FIG. 9, the display device 900 further includes a light source 94 disposed in the gap 91. The light source 94 generates the first light rays 971 that emit into and then that emit out of the light emitting modules 9, and second light rays 972 emitting into the first flat surface 211.

The first flat surface 211 is a transparent structure. The first and second outer inclined surfaces 224, 226 are configured to receive the second light rays 972 from the first flat surface 211 and then reflect the second light rays 972 so as to block the second light rays 972 from emitting out of the first and second outer inclined surfaces 224, 226 by means of total reflection or a large angle deflection. Alternatively, the first flat surface 211 may be a non-transparent structure which blocks penetration of the second light rays 972 therethrough, further blocking the position corresponding to the gap 91 to form extra bright lines, and avoiding causing visual interference to the viewers.

Figure 10:
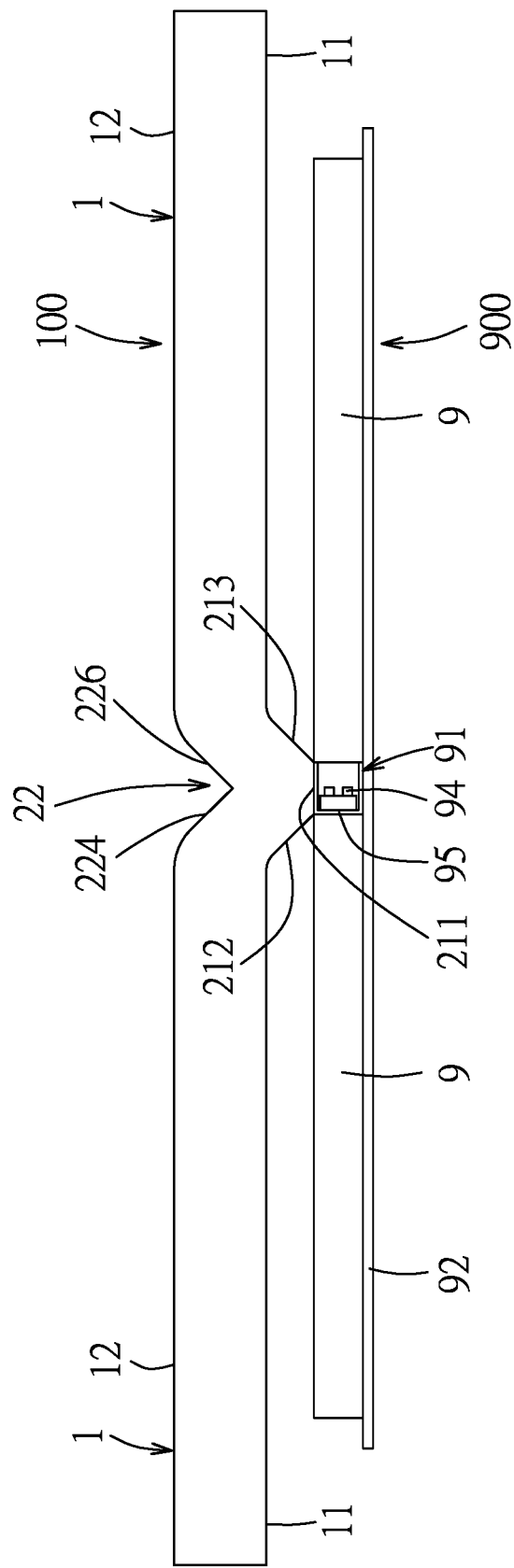
FIG. 10 is a side view of the first embodiment mounted to another alternative form of the display device.
Figure 11:
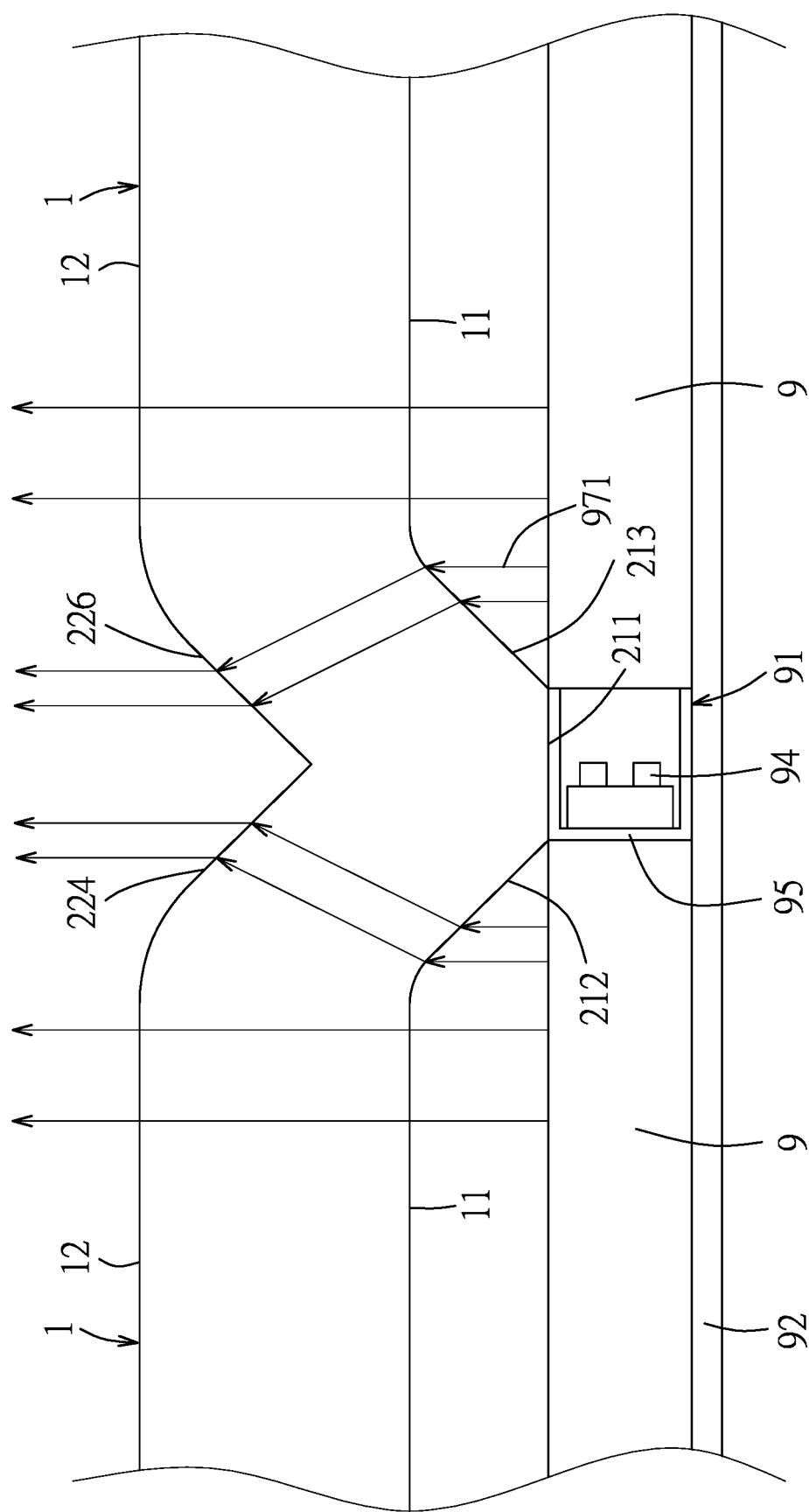
FIG. 11 is an enlarged fragmentary schematic view of FIG. 10, illustrating the path of the first light rays.

Referring to FIGS. 10 and 11, each of the light emitting modules 9 includes a light guide plate (not shown), and the display device 900 further includes a frame 95 disposed in the gap 91 and having one side connected to the support plate 92, and a light source 94 fixed inside the frame 95. The light source 94 may be, for example, an LED light bar. The light source 94 generates the first light rays 971 that enter the light guide plates of the light emitting modules 9 and that emit out of the light emitting modules 9. As shown in FIG. 11, the first light rays 971 entering the first optical portion 1 emit out through the light exit surface 12 along the predetermined direction, and the first light rays 971 incident on the first inner inclined surface 212 and the first light rays 971 incident on the second inner inclined surface 213 are guided toward the outer optical structure 22 which is located above the first flat surface 211 and which covers the black (dark) lines formed by the gap 91.

Figure 12:
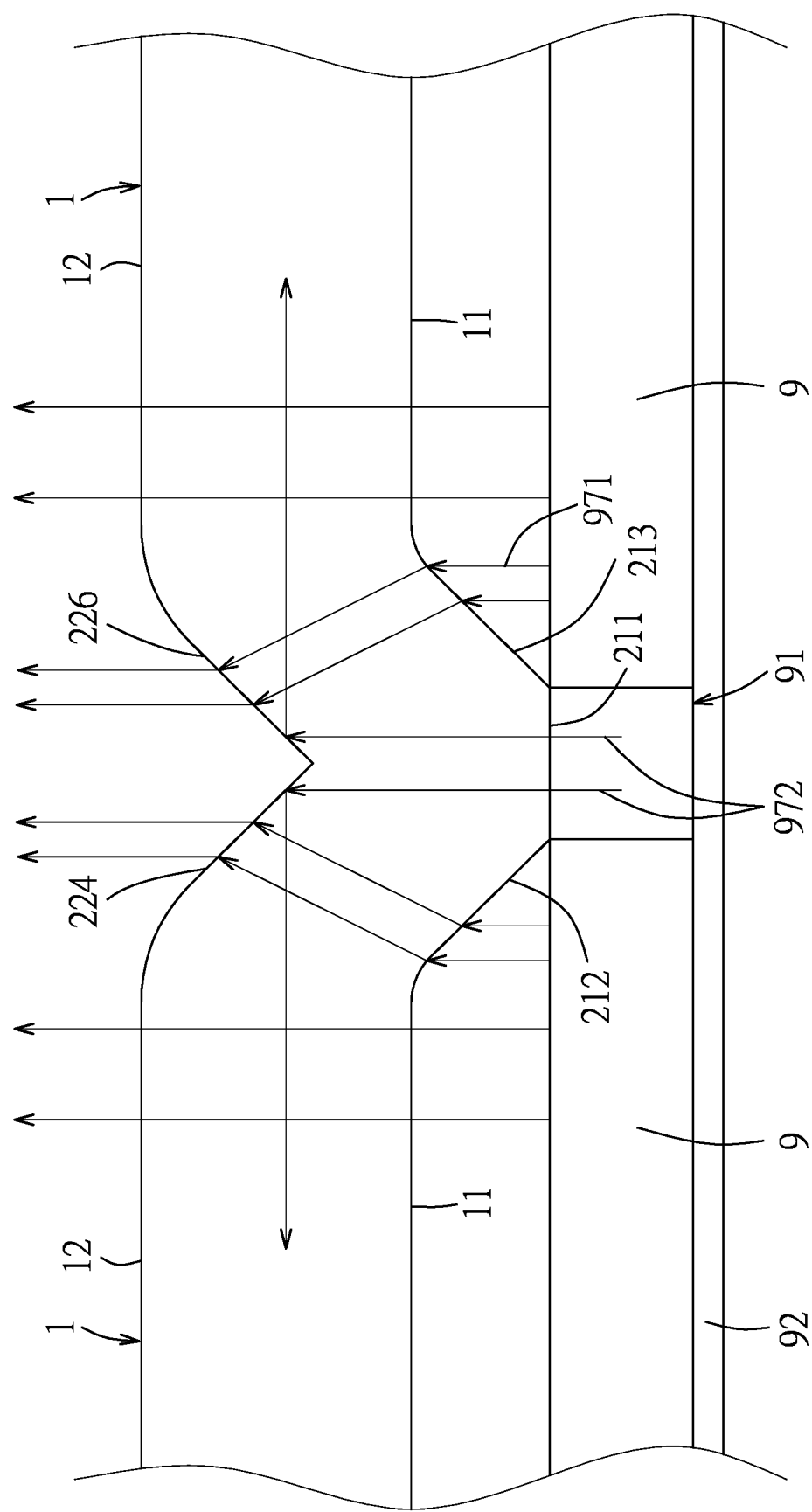
FIG. 12 is a side view of the first embodiment mounted to yet another alternative form of the display device.

Referring to FIG. 12, when the light source 94 is not provided between the light guide plates of the light emitting modules 9, and when second light rays 972 (for example, stray light rays) are incident on the first flat surface 211 which is a transparent structure, the second light rays 972 can pass through the first flat surface 211. The first and second outer inclined surfaces 224, 226 can receive the second light rays 972, and then block the second light rays 972 from emitting out by means of total reflection or a large angle deflection. Alternatively, the first flat surface 211 may be a non-transparent structure coated with a non-transparent material, thereby blocking penetration of the second light rays 972 therethrough, further blocking the position corresponding to the gap 91 to form extra bright lines, and avoiding causing visual interference to the viewers.

Figure 13:
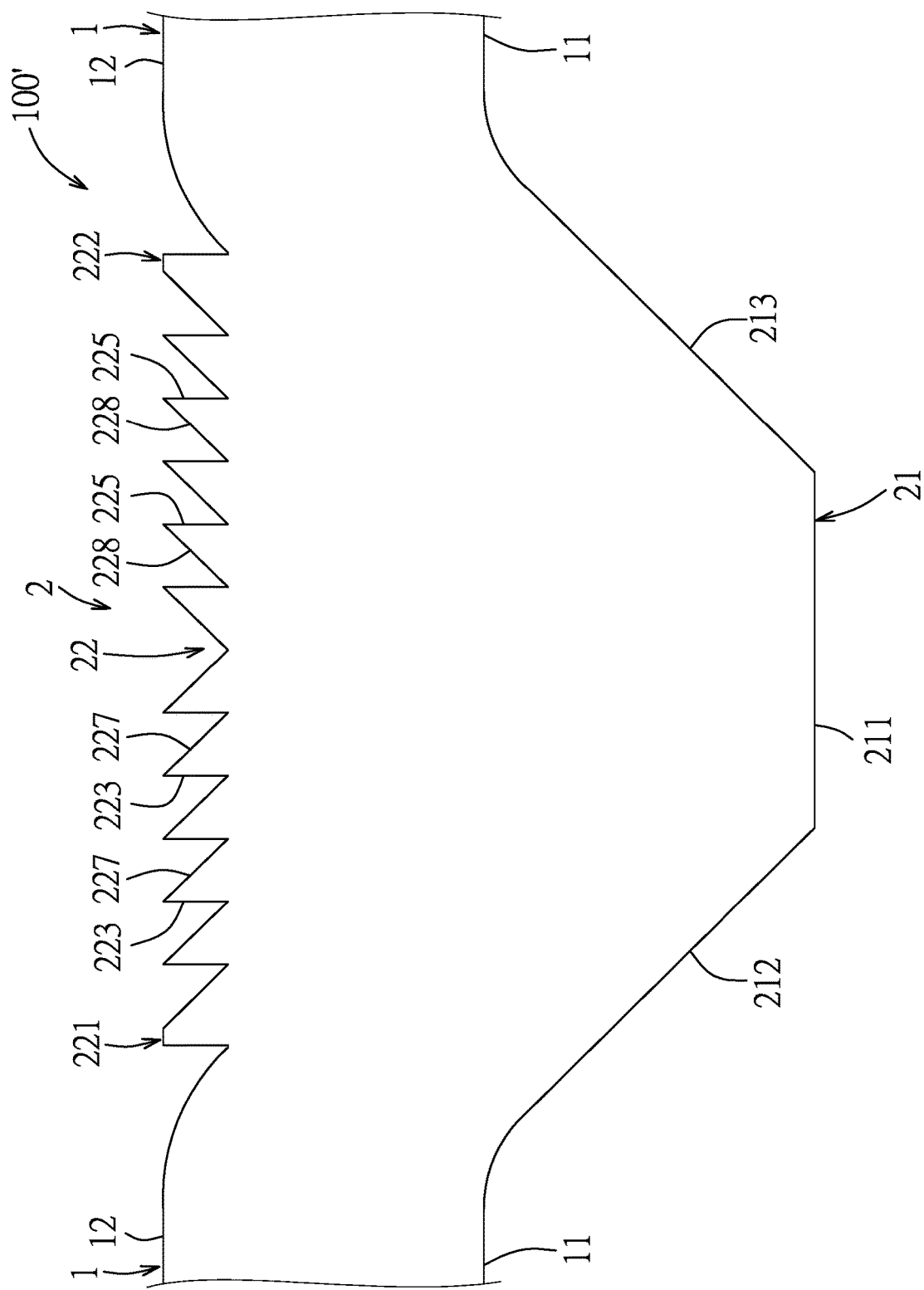
FIG. 13 is an enlarged fragmentary schematic view of a second optical portion of an optical plate according to the second embodiment of this disclosure.
Figure 14:
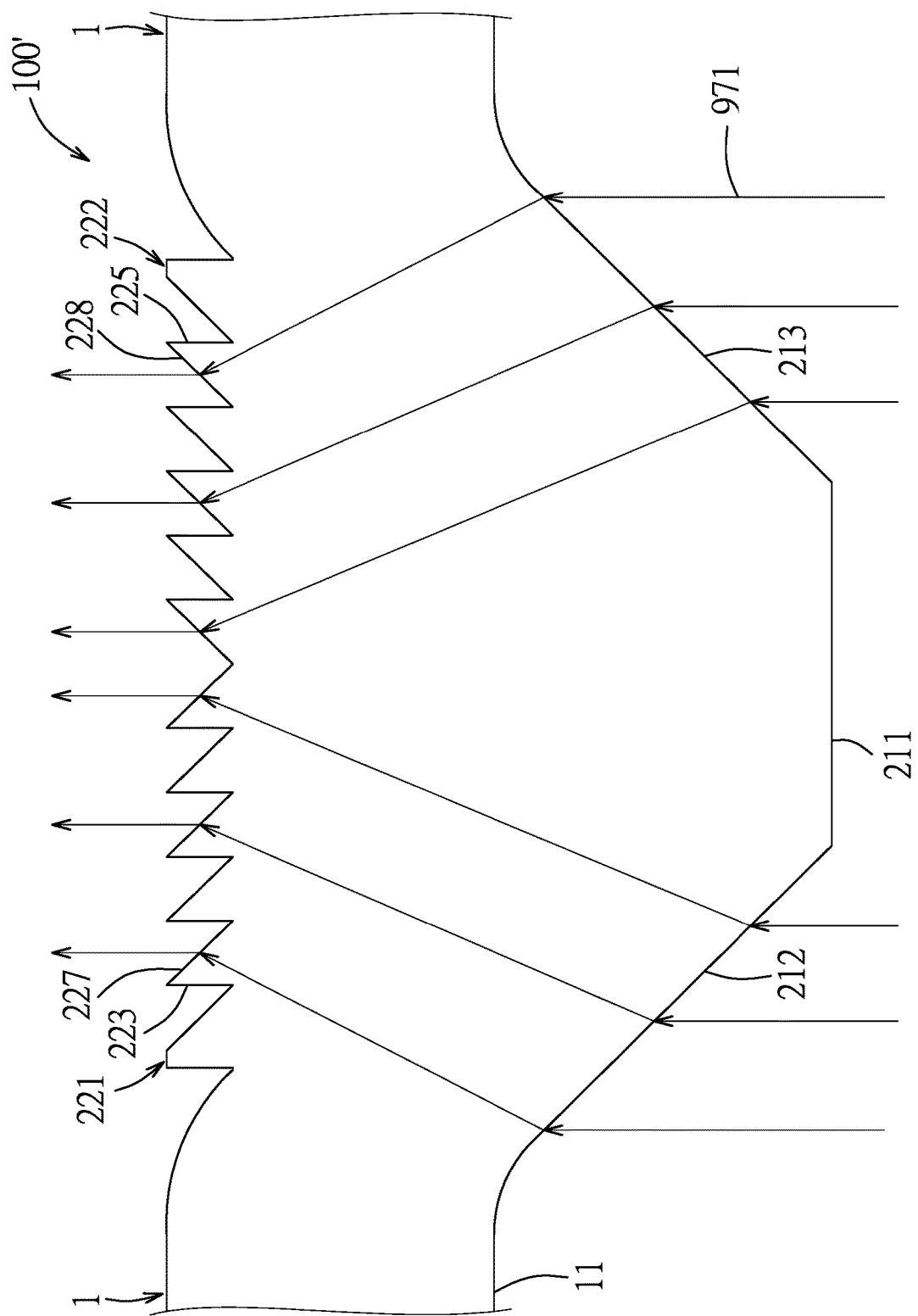
FIG. 14 is a view similar to FIG. 13, but illustrating the path of the first light rays.

Referring to FIGS. 13 and 14, an optical plate 100' according to the second embodiment of this disclosure is shown to be similar to the first embodiment. However, in this embodiment, the outer optical structure 22 of the second optical portion 2 is a Fresnel lens. That is, the outer optical structure 22 has a first face portion 221 and a second face portion 222. Each of the first and second face portions 221, 222 has a plurality of concave and convex surfaces. In this embodiment, the first face portion 221 has a plurality of spaced-apart first straight faces 223 perpendicular to the first flat surface 211, and a plurality of first inclined faces 227 parallel to the first inner inclined surface 212. Each first inclined face 227 is located between two adjacent ones of the first straight faces 223. Each first inclined face 227 has one lateral edge connected to a top edge of one of the two adjacent first straight faces 223, and another lateral edge connected to a bottom edge of the other one of the two adjacent first straight faces 223.

The second face portion 222 has a plurality of spaced-apart second straight faces 225 parallel to the first straight faces 223, and a plurality of second inclined faces 228 parallel to the second inner inclined surface 213. The structure of the second face portion 222 is similar to that of the first face portion 221, and differs in that the inclining direction of the second inclined faces 228 are opposite to that of the first inclined faces 227. Through the structure of the Fresnel lens, the first light rays 971 can similarly be caused to emit out along the predetermined direction. Moreover, since the first face portion 221 and the second face portion 222 are located at the same height, by simultaneously adjusting the height positions of the first and second face portions 221, 222 to be close to the inner optical structure 21, the thickness of the first optical portion 1 can become thin, thereby achieving the effects of reducing the production costs and the overall weight.

Figure 15:
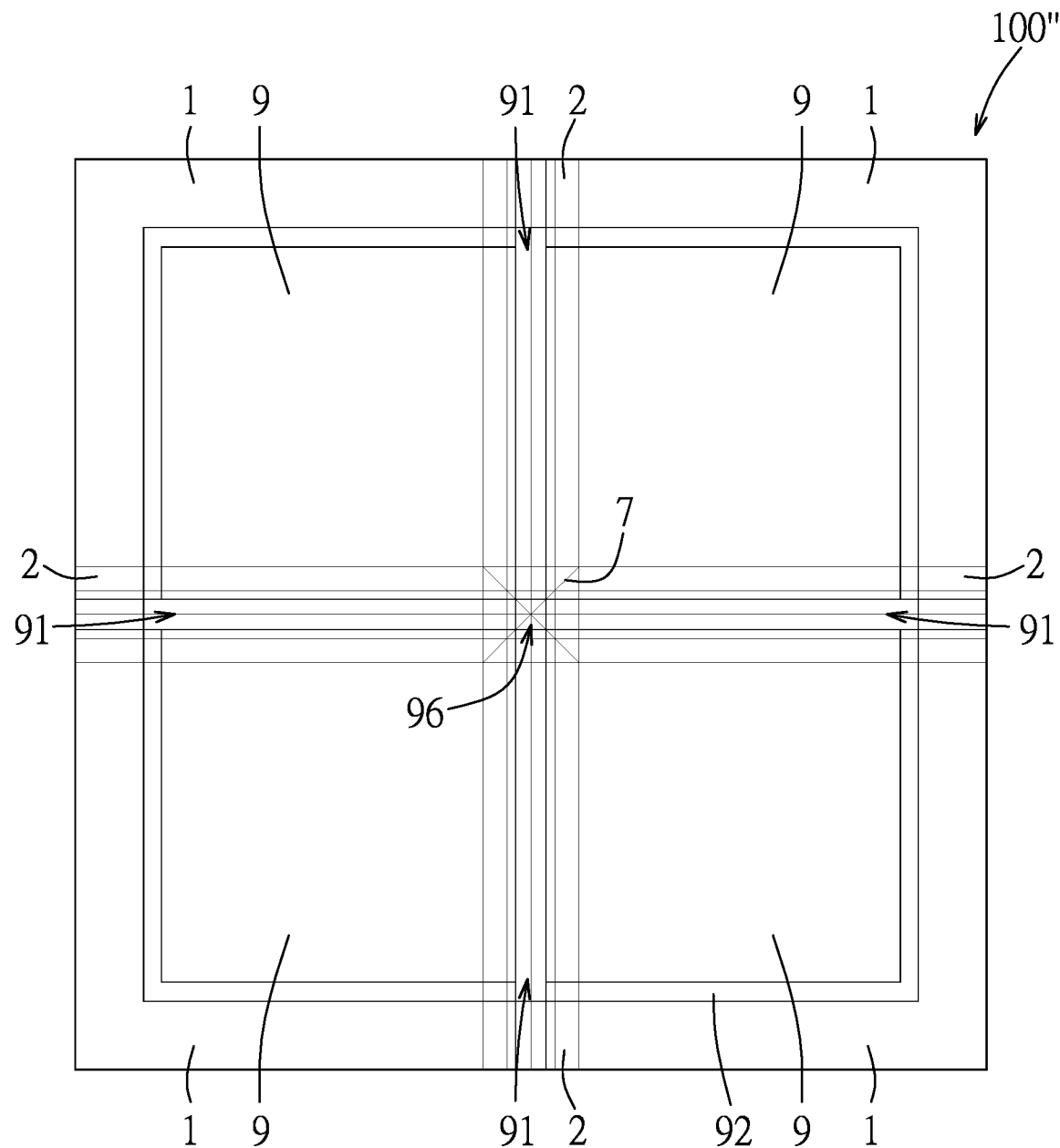
FIG. 15 is a front view of an optical plate according to the third embodiment of this disclosure mounted on a display device.
Figure 16:
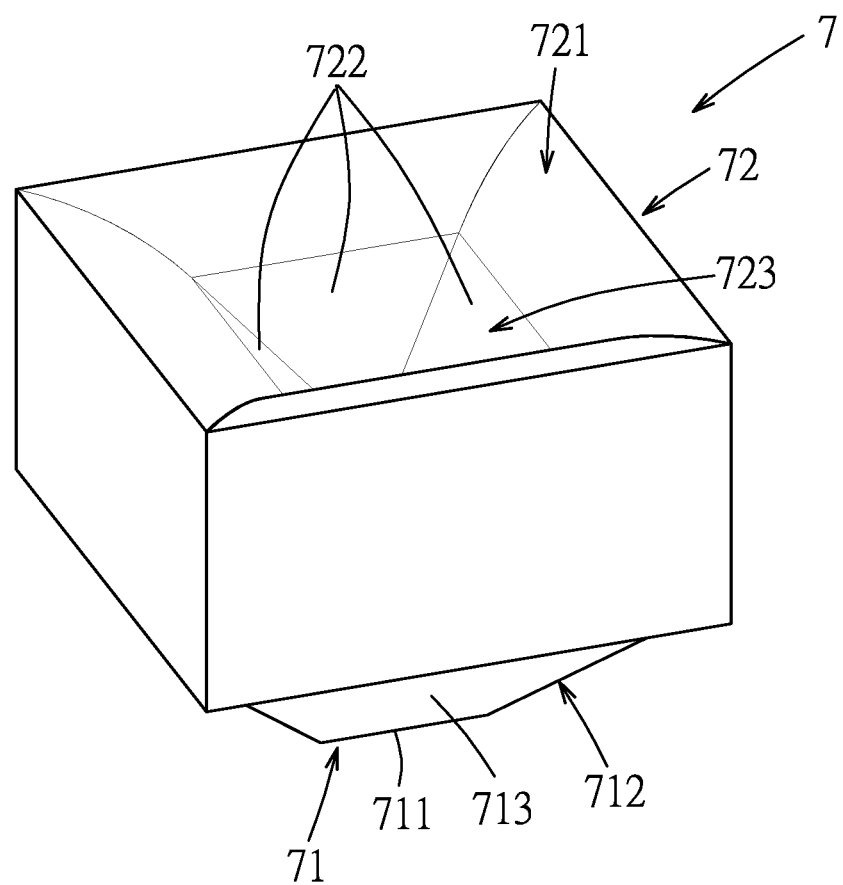
FIG. 16 is a perspective view of a third optical portion of the third embodiment.
Figure 17:
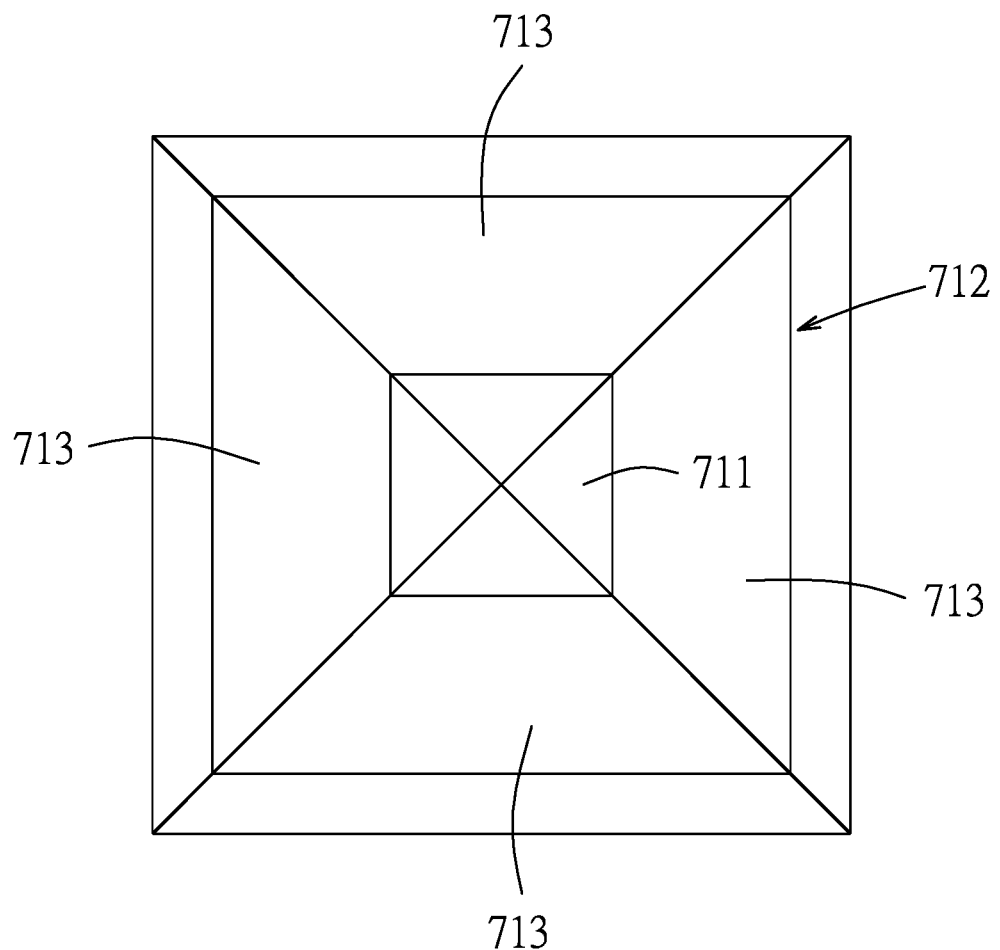
FIG. 17 is a bottom view of the third optical portion.

Referring to FIGS. 15 to 17, an optical plate 100″ according to the third embodiment of this disclosure is shown to be similar to the first embodiment. However, in this embodiment, the optical plate 100″ comprises four first optical portions 1, four second optical portions 2 and a third optical portion 7.

The display device 900 includes four light emitting modules 9 arranged in a matrix to form an intersection 96. The gap 91 is formed between each two adjacent ones of the light emitting modules 9, and is connected to the intersection 96. Each light emitting module 9 is exemplified as a display which is capable of emitting the first light rays 971 (see FIG. 5).

The first optical portions 1 respectively cover the light emitting modules 9. Each second optical portion 2 is connected between two adjacent ones of the first optical portions 1, and covers the gap 91 formed between each two adjacent ones of the light emitting modules 9. The structures of the first and second optical portions 1, 2 are similar to those described in the first embodiment, so that a detailed description thereof is omitted herein. The second optical portion 2 of the third embodiment may be replaced by that of the second embodiment, and is not limited to that of the first embodiment. It is worth to mention herein that the emitting direction of the first light rays 971 emitted out of the first and second optical portions 1, 2 are parallel to the light entry direction of the first light rays 971.

The third optical portion 7 is located among the second optical portions 2, and has four lateral sides respectively connected to the second optical portions 2. The third optical portion 7 covers the intersection 96, and has a second inner optical structure 71 corresponding to the intersection 96, and a second outer optical structure 72 opposite to the second inner optical structure 71. The second inner optical structure 71 has a second flat surface 711 facing the intersection 96, and a first inclined portion 712 extending radially and outwardly from a periphery of the second flat surface 711 toward the second optical portions 2. In this embodiment, the second flat surface 711 has a square shape, and faces the intersection 96 to receive all the light rays from the intersection 96 and guide the light rays toward the second outer optical structure 72. The first inclined portion 712 has four inclined faces 713. Each inclined face 713 has one edge connected to a respective one of four lateral edges of the second flat surface 711 and extending radially, outwardly and inclinedly from the respective lateral edge of the second flat surface 711 to overlap a portion of the corresponding light emitting module 9, so that the inclined faces 713 can receive the first light rays 971 that are emitted from the respective light emitting modules 9 and that have a path similar to that shown in FIG. 5, and then guide the first light rays 971 toward the second outer optical structure 72.

The second outer optical structure 72 has a second inclined portion 721 with a slope matching that of the first inclined portion 712. In this embodiment, the second inclined portion 721 has four interconnected inclined faces 722 cooperatively defining a groove 723 with an inverted conical shape. The slope of each inclined face 722 is equal to the slope of the respective inclined face 713. Through this, the first light rays 971 guided by the inclined faces 713 can emit out in an emitting direction parallel to the predetermined direction. Further, the light rays from the second flat surface 711 are totally reflected or deflected at a large angle, and are prevented to emit toward the viewers.

Figure 18:
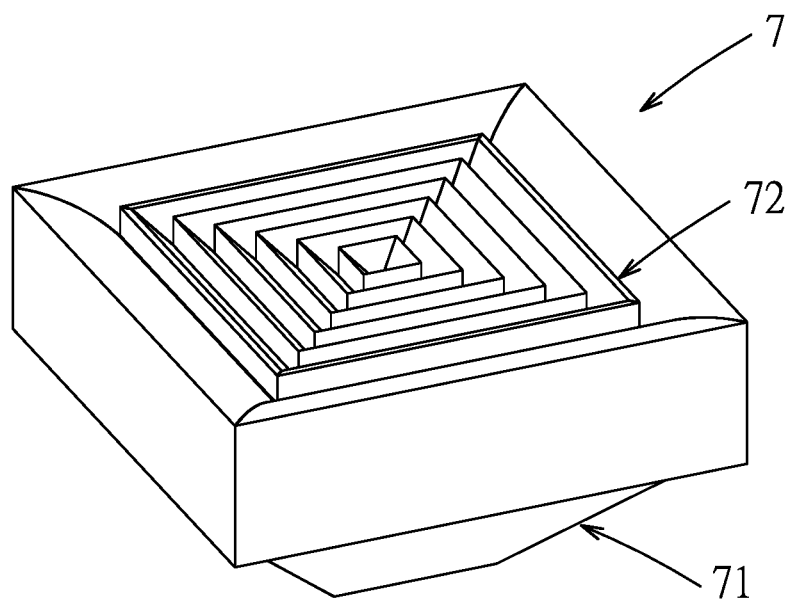
FIG. 18 is a perspective view of an alternative form of the third optical portion.

Alternatively, as shown in FIG. 18, the second outer optical structure 72 may also be a Fresnel lens.

In sum, through the inner optical structure 21 of the optical plate 100, 100′, 100″ of this disclosure, the first light rays 971 are guided toward the outer optical structure 22 which corresponds to the gap 91, so that the pictures displayed by the light emitting modules 9 can be extended, and the black or dark lines formed by the gap 91 can be covered. Further, through the outer optical structure 22, the first light rays 971 can emit out along the predetermined direction. Through this, the viewers can see the picture without the dark lines. Therefore, the object of this disclosure can indeed be achieved.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. An optical plate suitable for mounting on a display device which includes at least two light emitting modules spaced apart from each other to form a gap between adjacent lateral edges thereof, each of the at least two light emitting modules being capable of emitting first light rays, said optical plate comprising:

at least two first optical portions configured to respectively cover the at least two light emitting modules, each of said at least two first optical portions having a light entry surface configured to receive the first light rays emitted from a respective one of the at least two light emitting modules and being configured to cause the first light rays to emit along a predetermined direction; and at least one second optical portion connected between said at least two first optical portions and configured to cover the gap, said at least one second optical portion having an inner optical structure corresponding to the gap, and an outer optical structure opposite to said inner optical structure, said inner optical structure having a first flat surface facing the gap, and a first inner inclined surface and a second inner inclined surface extending inclinedly, outwardly and respectively from two opposite lateral edges of said first flat surface toward said light entry surfaces of said at least two first optical portions, said outer optical structure having a first outer inclined surface opposite to said first inner inclined surface, and a second outer inclined surface opposite to said second inner inclined surface, said first outer inclined surface having a slope matching that of said first inner inclined surface, said second outer inclined surface having a slope matching that of said second inner inclined surface, each of said first and second inner inclined surfaces being configured to guide the first light rays emitted from the respective one of the at least two light emitting modules toward a respective one of said first and second outer inclined surfaces such that the first light rays emitting out of said first and second outer inclined surfaces are parallel to said predetermined direction.

2. The optical plate as claimed in claim 1, wherein each of said at least two first optical portions further has a light exit surface opposite to said light entry surface, said optical plate further comprising a first inner arcuate portion connected between said first inner inclined surface and said light entry surface of one of said at least two first optical portions, a second inner arcuate portion connected between said second inner inclined surface and said light entry surface of the other one of said at least two first optical portions, a first outer arcuate portion connected between said first outer inclined surface and said light exit surface of one of said at least two first optical portions and having a curvature matching that of said first inner arcuate portion, and a second outer arcuate portion connected between said second outer inclined surface and said light exit surface of the other one of said at least two first optical portions and having a curvature matching that of said second inner arcuate portion.

3. The optical plate as claimed in claim 2, wherein said first and second outer inclined surfaces are connected to each other to form a V-shaped cross section, and a junction of said first and second outer inclined surfaces is located corresponding to the center of said first flat surface.

4. The optical plate as claimed in claim 3, wherein the display device further includes a light source disposed in the gap, the light source generating the first light rays that emit into and then that emit out of the at least two light emitting modules, and second light rays emitting into said first flat surface, and wherein said first flat surface is a transparent structure, said first and second outer inclined surfaces being configured to receive the second light rays from said first flat surface and then reflect the second light rays so as to block the second light rays from emitting out of said first and second outer inclined surfaces.

5. The optical plate as claimed in claim 3, wherein the display device further includes a light source disposed in the gap, the light source generating the first light rays that emit into and that emit out of the at least two light emitting modules, and second light rays emitting into said first flat surface, and wherein said first flat surface is a non-transparent structure which blocks penetration of the second light rays.

6. The optical plate as claimed in claim 2, wherein said outer optical structure is a Fresnel lens.

7. The optical plate as claimed in claim 6, wherein each of the at least two light emitting modules includes a light guide plate, and the display device further includes a light source disposed in the gap, the light source generating the first light rays that emit into and that emit out of the at least two light emitting modules, and second light rays emitting into said first flat surface, and wherein said first flat surface is a transparent structure, said first and second outer inclined surfaces being configured to receive the second light rays from said first flat surface and then reflect the second light rays so as to block the second light rays from emitting out of said first and second outer inclined surfaces.

8. The optical plate as claimed in claim 6, wherein each of the at least two light emitting modules includes a light guide plate, and the display device further includes a light source disposed in the gap, the light source generating the first light rays that emit into and that emit out of the at least two light emitting modules, and second light rays emitting into said first flat surface, and wherein said first flat surface is a non-transparent structure which blocks penetration of the second light rays.

9. The optical plate as claimed in claim 1, wherein:
the display device includes four light emitting modules arranged in a matrix to form an intersection, the gap is formed between each two adjacent ones of the light emitting modules and is connected to the intersection, and wherein said optical plate comprises four said first optical portions configured to respectively cover the light emitting modules, and four said second optical portions each of which is connected between two adjacent ones of said first optical portions and each of which is configured to cover the gap formed between each two adjacent ones of the light emitting modules; and
said optical plate further comprises a third optical portion disposed among said second optical portions and configured to cover the intersection, said third optical portion having a second inner optical structure corresponding to the intersection, and a second outer optical structure opposite to said second inner optical structure, said second inner optical structure having a second flat surface facing the intersection, and a first inclined portion extending radially and outwardly from a periphery of said second flat surface toward said second optical portions, said second outer optical structure having a second inclined portion with a slope matching that of said first inclined portion, said first inclined portion being configured to guide the first light rays emitted from the light emitting modules toward said second inclined portion, such that the first light rays emitting out of said second inclined portion are parallel to said predetermined direction.

10. The optical plate as claimed in claim 9, wherein said second inclined portion has four interconnected inclined faces cooperatively defining a groove with an inverted conical shape.

11. The optical plate as claimed in claim 9, wherein said second outer optical structure is a Fresnel lens.

* * * * *